(12) United States Patent
Suzuki

(10) Patent No.: US 6,246,635 B1
(45) Date of Patent: Jun. 12, 2001

(54) ELECTRIC AND ELECTRONIC EQUIPMENT

(76) Inventor: Takashi Suzuki, 272 Kan'no, Yamada-machi, Katori-gun, Chiba-ken 289-0408 (JP)

( * ) Notice: Subject to any disclaimer, the term of this patent is extended or adjusted under 35 U.S.C. 154(b) by 0 days.

(21) Appl. No.: 09/319,503

(22) PCT Filed: Oct. 20, 1998

(86) PCT No.: PCT/JP98/04716

§ 371 Date: Jun. 7, 1999

§ 102(e) Date: Jun. 7, 1999

(87) PCT Pub. No.: WO99/22382

PCT Pub. Date: May 6, 1999

(30) Foreign Application Priority Data

Oct. 24, 1997 (JP) .................................... 9/341854
Nov. 5, 1997 (JP) .................................... 9/353973

(51) Int. Cl.[7] .................................................. G11C 8/00
(52) U.S. Cl. ................................................... 365/233
(58) Field of Search .................... 365/189.01, 189.02, 365/189.08, 194, 199, 205, 226, 227, 229, 233, 230.08

(56) References Cited

U.S. PATENT DOCUMENTS

| | | | | |
|---|---|---|---|---|
| 5,118,975 | * | 6/1992 | Hillis et al. ........................... | 307/602 |
| 5,256,912 | * | 10/1993 | Rios ...................................... | 307/269 |
| 5,369,640 | * | 11/1994 | Watson et al. .......................... | 371/1 |
| 5,566,138 | * | 10/1996 | Lombreschi et al. ................. | 368/157 |
| 5,886,582 | * | 3/1999 | Stansell ................................ | 331/1 A |

* cited by examiner

Primary Examiner—David Nelms
Assistant Examiner—Thong Le

(57) ABSTRACT

There are circuits to reduce consuming power of an electric and electronic equipment; a circuit to control clocks(4) for each device by a CPU, and to be variable by dividing clock, a circuit to access from the synchronous CPU to an asynchronous memory(5) in high speed, a standby circuit connecting a relay(2) to an AC to DC converter(1) without any transformers and a communication circuit(3) connecting to an external apparatus with photo couplers. By the above, these exclude futile power with high speed clock and loss of a transformer circuit.

16 Claims, 5 Drawing Sheets

ELECTRIC AND ELECTRONIC EQUIPMENT

FIELD OF THE INVENTION

This invention relates to the electric and electronic equipment with a clock circuit, a memory circuit and a standby circuit which opens and closes power supply in special condition.

BACKGROUND OF THE INVENTION

Here to fore, we have requested the electric and electronic equipment like a personal computer convenient functions, high speed operations and low consuming power. It is performed by including high integrated IC and exchanging the IC from NMOS to CMOS.

And now, we need higher speed and lower consuming power on standby. But the high speed clock and the loss of transformer circuit interfere this realization.

SUMMARY OF THE INVENTION

This invention is composed of a clock circuit which controls clocks by a CPU, a memory circuit which accesses to an asynchronous memory from the synchronous CPU in high speed, a standby circuit which runs by an AC to DC converter without any transformers and which drives an equipment by a relay circuit and a communication circuit connecting to an external appliance.

BRIEF DESCRIPTION OF THE DRAWINGS

FIGS. 11 and 12 are relay circuits which use these AC to DC converters.

FIG. 13 is a relay circuit composed of transistors and diodes.

FIG. 14 is a communication circuit connecting to an external appliance with photo couplers and a transistor.

DETAILED DESCRIPTION OF THE INVENTION

This refers more particularly to this invention with the figures.

Figure 1:
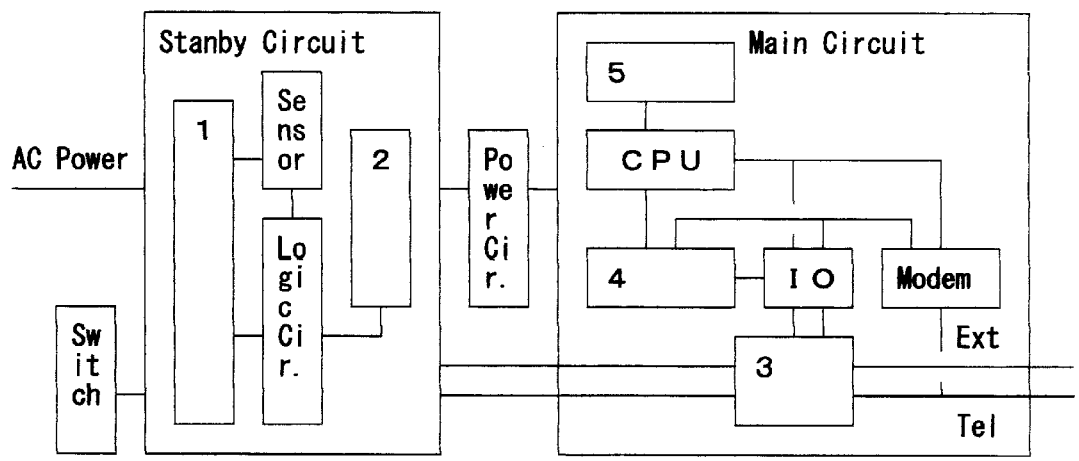
FIG. 1 is a whole figure of an electric and electronic equipment with this invention.

FIG. 1 means a general concept figure of an electric and electronic equipment with this invention. An AC to DC converter 1 without any transformers supplies power of a standby circuit which opens and closes a relay 2. It is possible to communicate with an external appliance and a main circuit by a communication circuit 3 for connecting with photo couplers, and to be controlled by telephone line, infra red communication, a timer and sensors. In the main circuit, an IO circuit connected to a CPU controls clock 4. And there is high speed interface between the synchronous CPU and an asynchronous memory 5.

Figure 2:
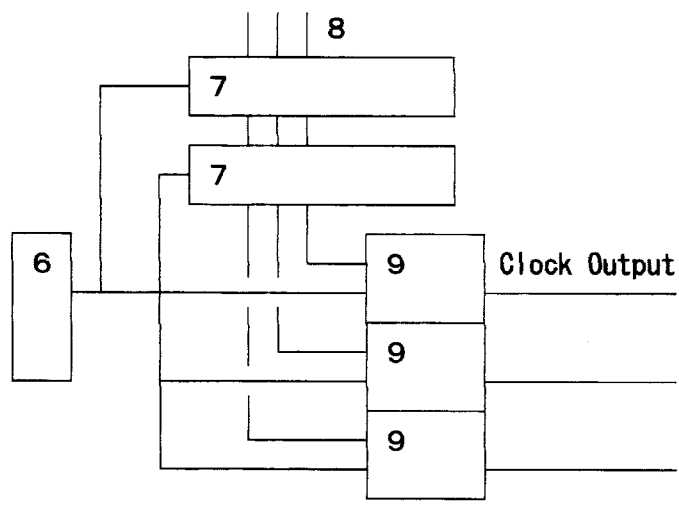
FIG. 2 is a circuit which controls docks for each device.
Figure 3:
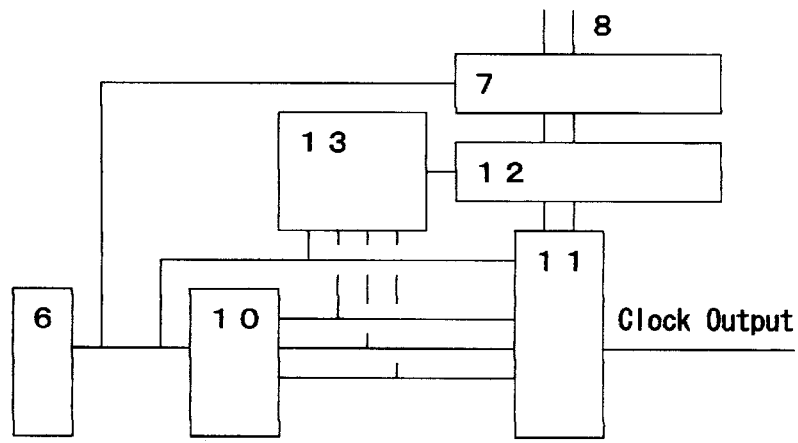
FIG. 3 is a circuit which changes frequency of clock by a counter and a multiplexer.

Like FIG. 2 or 3, when a CPU controls clock 6, it is necessary to synchronize control signal 8 with input clock 6 by a flip-flop or a latch 7 to kill abnormal clocks like hazard or meta-stable in output clock.

FIG. 2 shows a circuit to stop docks for devices out of use. It is possible to separate into blocks and to stop docks for each block in the device. The inputs to an OR gate or an AND gate 9 are the control signal synchronized with input clock 6 and separation of the clock, and the output is dock for each device. It is possible to exchange an OR gate and an AND gate by using inverters.

FIG. 3 is a circuit to down frequency of clock 6 by dividing with a counter 10. And it is possible to select frequency by a multiplexer 11. The selection of clock is synchronized by a flip-flop or a latch 12 with output of an OR gate or an AND gate 13 inputed main and divided docks.

Figure 4:
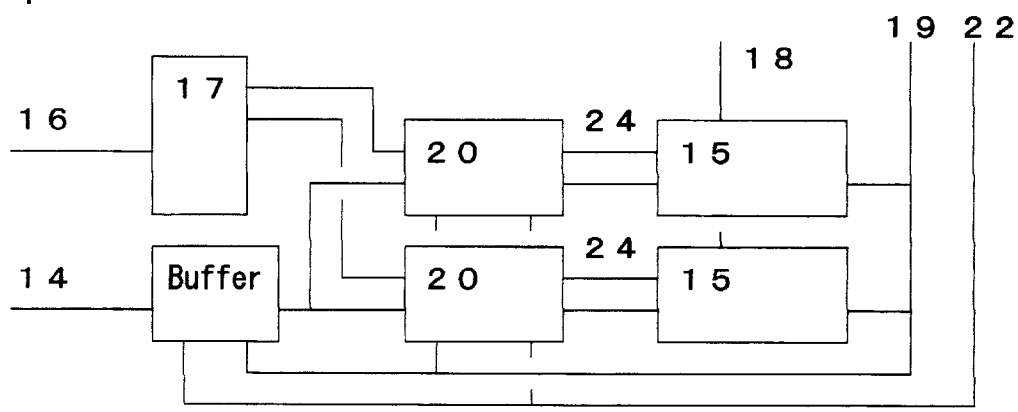
FIG. 4 is a concept figure of a memory circuit.

FIG. 4 is a concept figure of a circuit to access to an asynchronous memory from a synchronous CPU in high speed. Here to fore, there is a memory cell array for a bit data signal. In this invention, there are many memory cell arrays 15(a number of outputs of a decoder 17 of low address 16) for a bit data signal 14. It is selected by low address 16 which memory cell array is used.

At reading data, data in memory cell arrays 15 are read by upper address signal 18 and read signal 19. And the data is output with a buffer or a multiplexer in IO circuit 20 by decoding low address 16.

Figure 5:
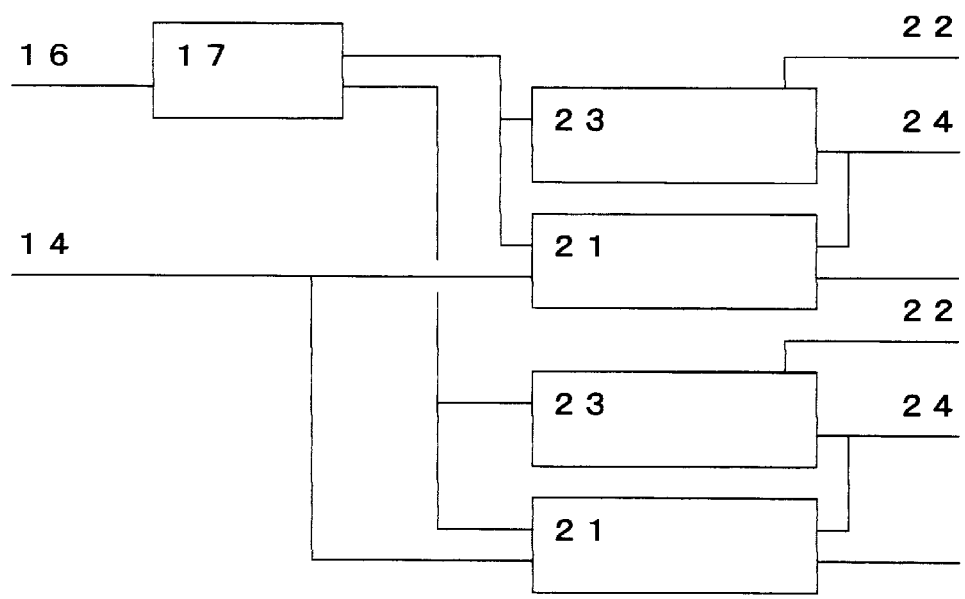
FIG. 5 is a write circuit in the memory circuit.

At writing data, like FIG. 5, output of the decoder 17 of low address signal 16 selects a flip-flop or a latch 21, and the data is kept. At a time, write enable signal 24 is kept in a flip-flop or a latch 23 inputted write signal 22, and the data is written to the memory cell array 15.

Clock or strobe signal is necessary to make timing of signals. It is good to include the decoder 17 of low address in a CPU or an IC for memory interface for high speed interface with external memory. In this case, it is possible to include also the flip-flop or the latch 23 for keeping the write enable signal in the CPU or the IC for memory interface.

And it is possible to be faster by including sense amps of memory in the IO circuit 20.

Next is a circuit which changes AC power to DC power without any transformers.

Figure 6:
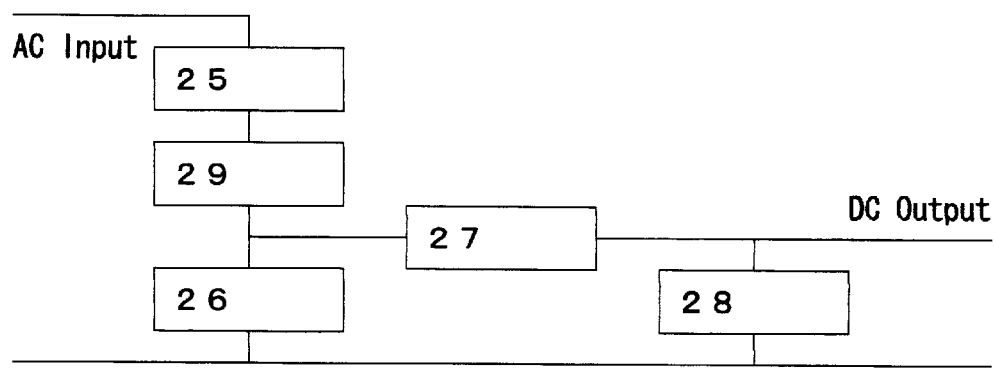
FIGS. 6 and 7 are AC to DC converter circuits without any transformers.
Figure 7:
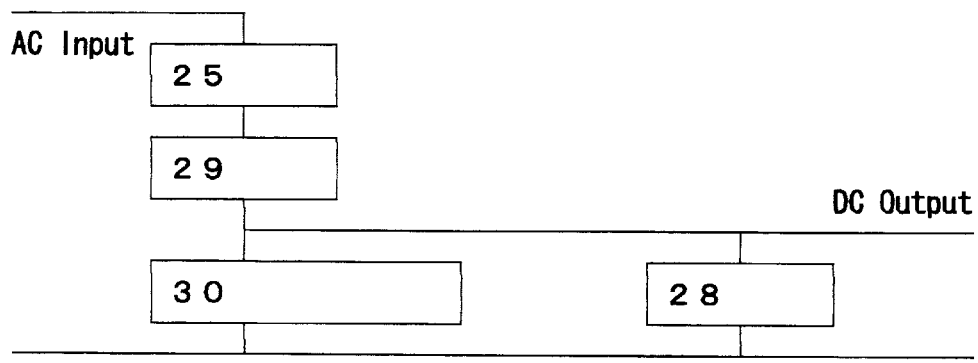
Figure 8:
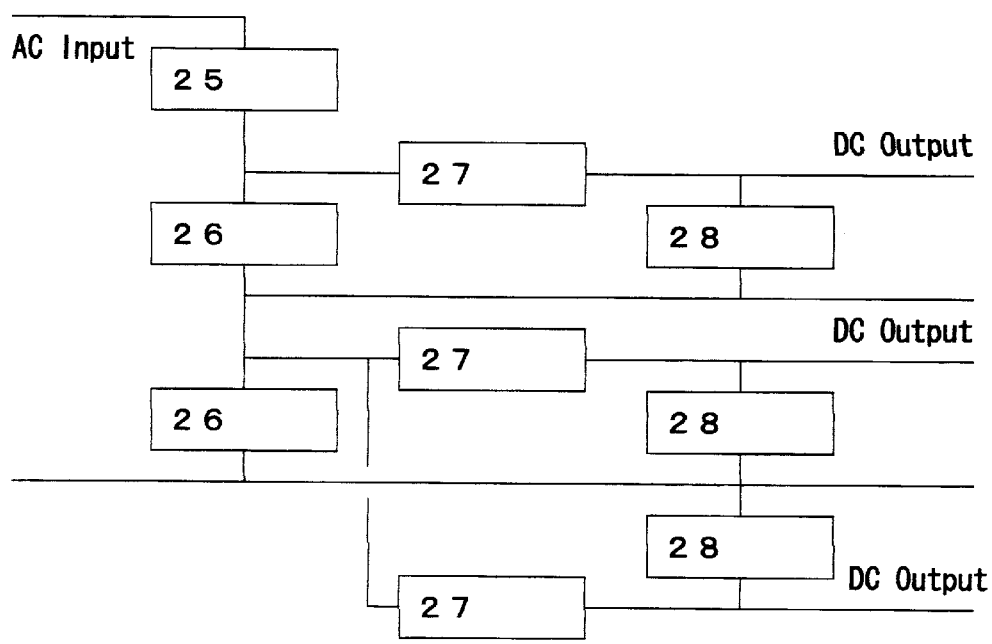
FIGS. 8 and 9 are AC to DC converter circuits which have many DC output sections.
Figure 9:
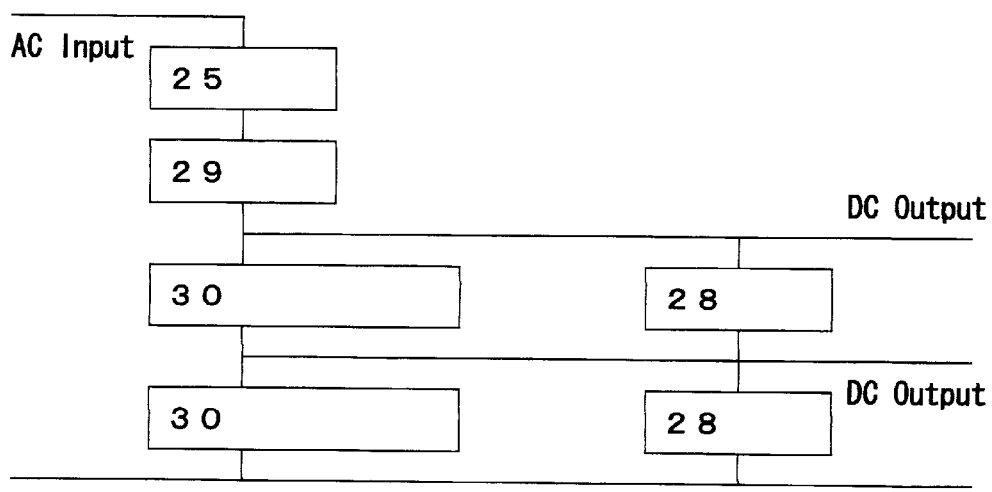

Though efficiency is not so good, resistors 25 26 are connected in series to AC power supply, divided potential of the resistor is rectified by a diode 27, and is smoothed by a condenser 28. It is possible to consume half wave by adding a diode 29 in the AC input section like FIG. 6, and to regulate voltage by exchanging the resistor 26 and the diode 27 to a Zener diode 30 in the DC output section like FIG. 7. It is possible to get variety and efficiency of power supply by connecting many DC output sections like FIG. 8 or 9.

Figure 10:
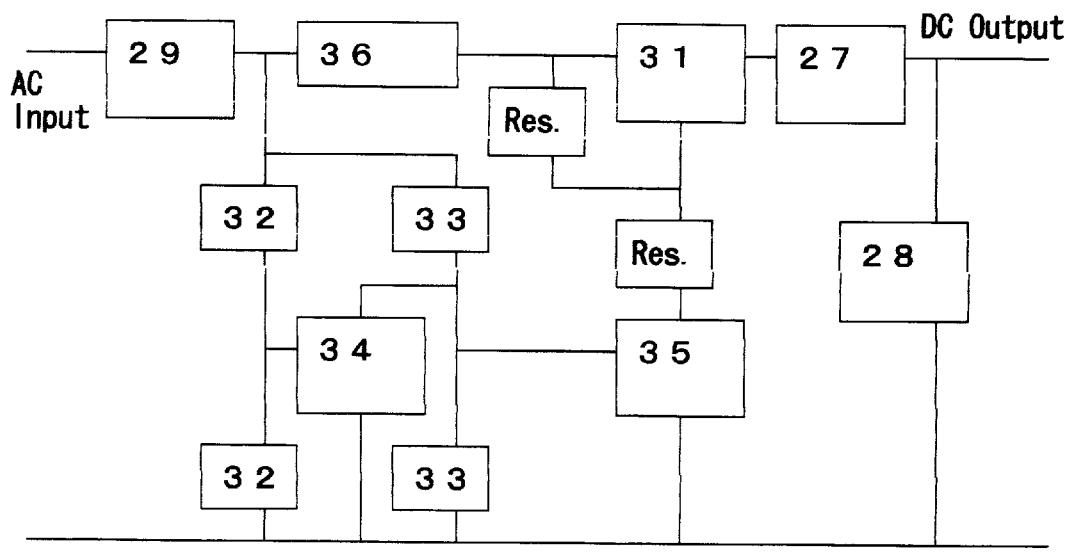
FIG. 10 is an AC to DC converter circuit which switches transistors by detecting input voltage.

FIG. 10 is a power circuit which switches a transistor 31 to get efficiency. Divided potentials of resistors 32 33 switch ON current by switching transistors 31 34 35 on condition that voltage of input power is within the range. The divided potential of first resistors 32 and a transistor 34 determine the highest voltage, and the divided potential of second resistors 33 and a transistor 35 determine the lowest voltage. It is useful to avoid wrong putting dry cells in DC power supply. For AC power supply, a resistor 36 to avoid rush current, diodes 27 29 and a condenser 28 are added.

Figure 11:
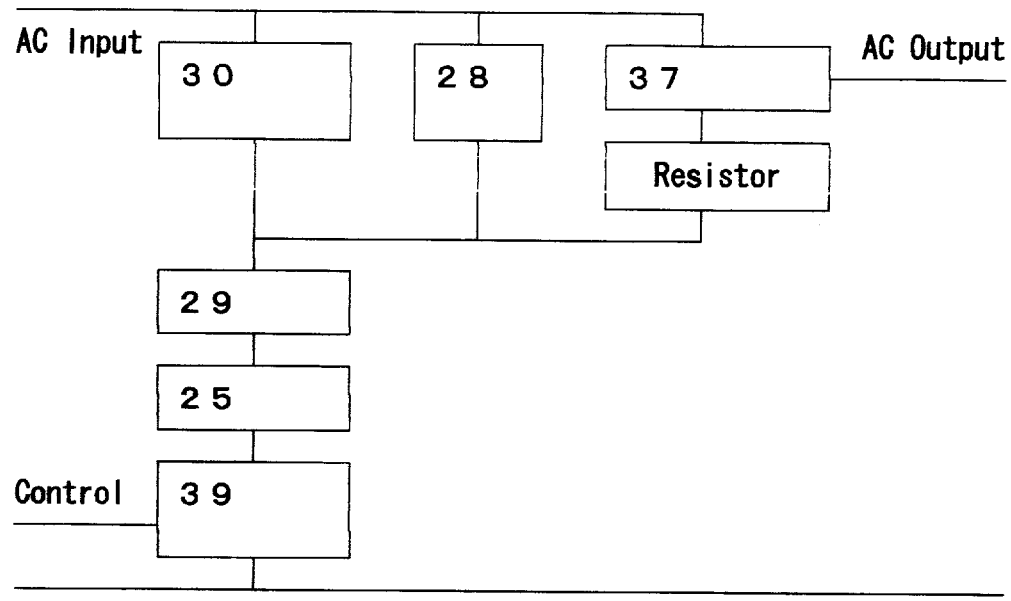
Figure 1:
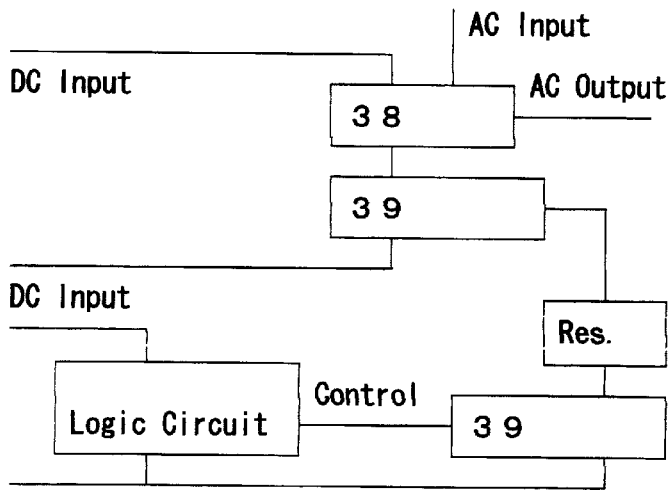
Figure 1:
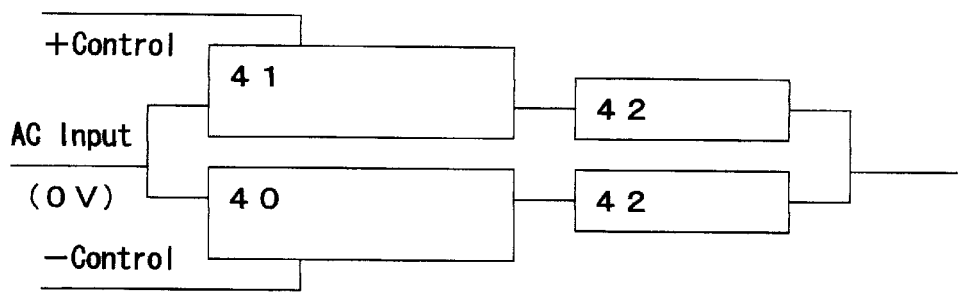
Figure 1:
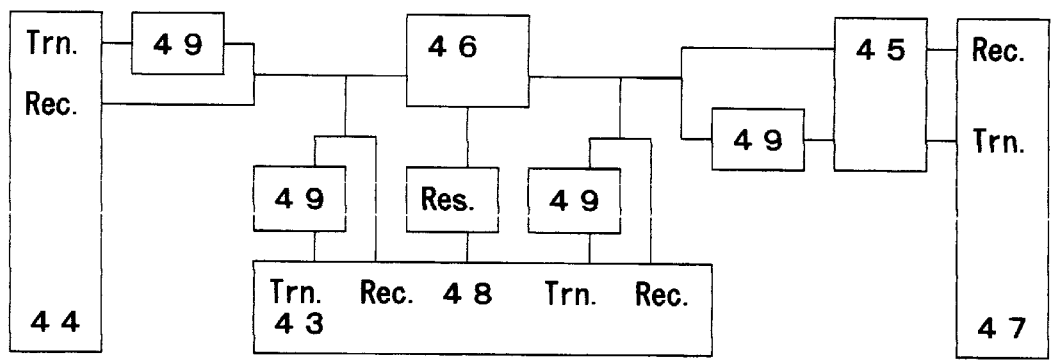

A relay circuit is made by connecting a triac 37 or a relay 38 to an AC to DC converter of this invention, and by switching an added transistor 39 like FIG. 11 or 12.

It is possible to operate a latching relay directly. A condenser 28 is charged at reset time and before or after operations, because current is limited by resistors 25 36 or a transistor 31 in AC to DC converters of this invention. It makes the relay OFF by detecting a power failure to avoid keeping power ON after a power failure. To detect a power failure, only a resistor or a photo coupler is connected to an AC to DC converter without any transformers.

It is possible to make a relay circuit by connecting transistors 40 41 and diodes 42 in forward and in series like FIG. 13. It matches to AC power supply by connecting in reverse and in parallel about a PNP type transistor or a P channel type FET 40 and about a NPN type transistor or a N channel type FET 41. It needs+ and– power supplies to control this relay, but it can control each half wave and closely. Using a bipolar transistor, it can control large current by Darlington connection or connecting a triac. Using a FET, it can control high power with low power, but you must be careful about leakage current and destruction in heat.

In case of making a standby circuit with an AC to DC converter without any transformers, it needs a photo coupler 45 to connect a main circuit 43 or an external appliance 44 like FIG. 14. Signal line from an external appliance 44 is connected to the main circuit 43, connected to the main circuit again through a transistor 46, and connected to the standby circuit 47 through photo couplers 45. When power of the main circuit is off or control signal 48 of the transistor is low, the signal from the external appliance 44 is transmitted to the standby circuit 47 through the transistor 46 and the photo coupler 45, so the power supply can be opened and closed. When the control signal 48 is high, the signal is interrupted by the transistor 46, so communication between the external appliance 44 and the main circuit 43 is possible. It is possible to communicate each other with two lines of signal and ground with resistors 49.

POSSIBILITY IN INDUSTRY

Over look, it is possible to reduce consuming power of an electronic equipment including a high speed CPU with the clock circuit and the memory circuit in this invention.

And it is possible to applicate the standby circuit and the communication circuit connecting to an external appliance in this invention to all electric and electronic equipments.

What is claimed is:

1. A clock circuit comprising, a flip-flop(7) for synchronizing control signal(8) with input clock(6) and means for controlling output clock.

2. The clock circuit claimed in claim 1, including a gate(9) inputted separation of the input clock and each the control signal for outputting the dock.

3. A clock circuit comprising:
   (a) a counter(10) for dividing input clock and outputting divided clock;
   (b) a gate(13) inputted the input clock and the divided clock;
   (c) a flip-flop(12) for synchronizing control signal with output of the gate; and
   (d) a mutiplexer(11) inputted the input clock and the divided clock controlled by output of the flip-flop, for outputting clock.

4. A memory circuit comprising:
   (a) a lot of memory cell arrays(15) connected high address signal(18) in common for each a bit data signal(14) and an IO circuit(20) for each output of a decoder(17) of low address signal(16) for outputting and writing the data;
   (b) the IO circuit for outputting the data by decoding the low address signal, after reading the data of the memory cell arrays by the high address signal and read signal (19); and
   (c) in each the IO circuit, a flipflop(23) for keeping write enable signal(24) and a second flip-flop(21) for keeping the data signal by the output of the decoder of the low address signal and write signal(22), and writing the data to the memory cell array by the high address signal and the write enable signal.

5. The memory circuit claimed in claim 4, wherein said decoder(17) of the low address signal is included in an IC for memory interface.

6. An AC to DC converter circuit comprising, a resistor (25) and a second resistor(26) connected to AC input power supply in series, a diode(27) for rectifying divided potential of the second resistor(26) and for stemming reverse current and a condenser (28) for smoothing DC output.

7. The AC to DC converter circuit claimed in claim 6, further comprising a second diode(29) for rectifying in the AC input section.

8. An AC to DC converter circuit comprising, a resistor, a diode and a Zener diode (30) connected to AC input power supply in series and a condenser for smoothing DC output voltage of the Zener diode.

9. The AC to DC converter circuit claimed in claim 6, 7 or 8, further comprising a second DC output section in series.

10. A relay circuit including, the AC to DC converter circuit claimed in claim 7 or 8, means(37) for relaying connected to the DC output section and a transistor(39) to switch in the AC input section.

11. A power circuit comprising, means for detecting voltage of input power and a transistor(31) to switch output power by upper limit of the voltage.

12. An AC to DC converter circuit including, the power circuit claimed in claim 11, a diode for rectifying in the input section, a second diode for stemming reverse current and a condenser for smoothing in the output section.

13. A detecting circuit of power failure comprising, an AC to DC converter with DC output and no transformer and a resistor for loading in the DC output section.

14. A relay circuit comprising:
   (a) a current limited power circuit, a condenser and a latching relay;
   (b) at reset, making the latching relay OFF after charging the condenser by an operating circuit;
   (c) at operating the latching relay, charging the condenser; and
   (d) at detecting power failure by a detecting circuit of power failure, making the latching relay OFF.

15. A relay circuit comprising, a transistor(40) and a diode(42) in forward and in series, a complementary transistor(41) and a second diode(42) in forward and in series, and connecting in reverse and in parallel as the transistors to ground.

16. A communication circuit comprising, a signal line from an external appliance(44) to a main circuit(43), a transistor(46) controlled by the main circuit to switch the signal line to a standby circuit(47) and a photo coupler(45) for connecting to the standby circuit.

* * * * *